United States Patent [19]

Becker

[11] 4,386,314

[45] May 31, 1983

[54] ELECTRICITY THEFT PREVENTING METER

[75] Inventor: Dale F. Becker, Seneca, S.C.

[73] Assignee: Sangamo Weston, Inc., Norcross, Ga.

[21] Appl. No.: 208,730

[22] Filed: Nov. 20, 1980

[51] Int. Cl.³ .............................................. G01R 11/24
[52] U.S. Cl. ....................................... 324/110; 339/37; 339/198 M; 361/372
[58] Field of Search .................... 324/110; 339/36, 37, 339/40, 198 M; 361/364, 369–373

[56] References Cited

U.S. PATENT DOCUMENTS 4,175,813 11/1979 Mentesana ............................. 339/36

Primary Examiner—Ernest F. Karlsen
Attorney, Agent, or Firm—Dale Gaudier

[57] ABSTRACT

An electricity meter has one of its bayonets provided with a movable barbed member which engages a terminal in the meter socket upon installation and causes the normal circuit to the measuring circuitry of the meter to be irrevocably broken when the meter is removed from the meter socket.

16 Claims, 4 Drawing Figures

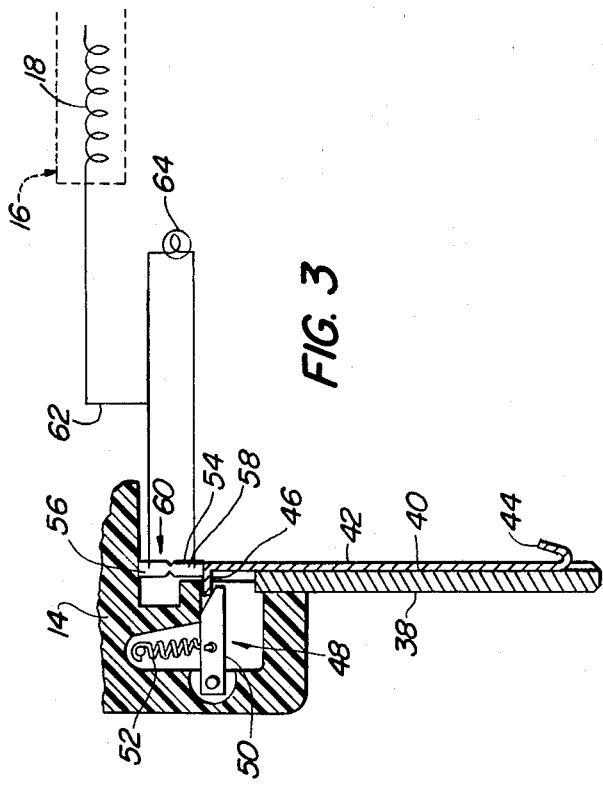
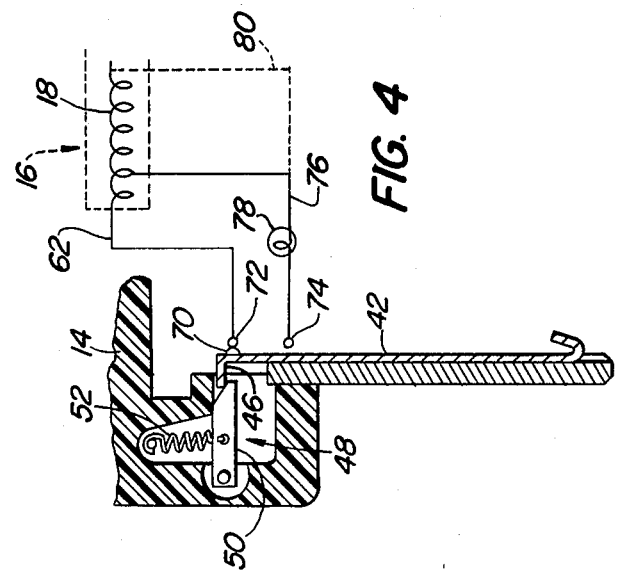
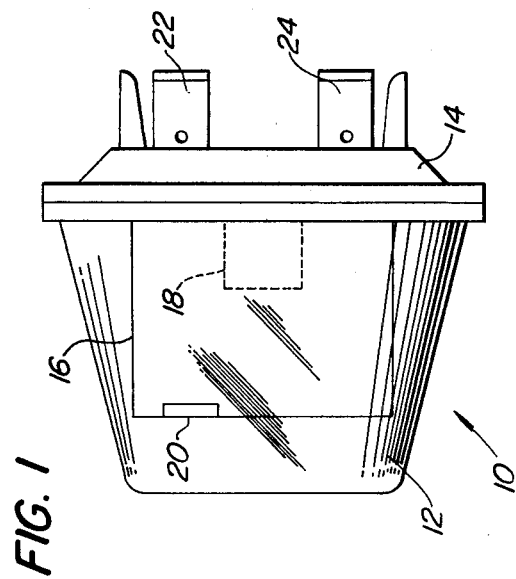
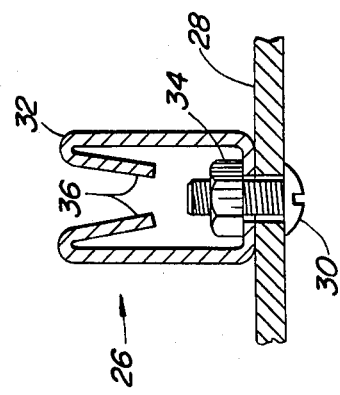

ELECTRICITY THEFT PREVENTING METER

BACKGROUND OF THE INVENTION

The present invention relates generally to electricity theft combating meters and more particularly to meters which are rendered inoperative or read fast if removed from and reinstalled in their sockets.

In recent years, with the increase in the cost of electricity there has been a corresponding increase in the tampering with electricity meters to steal electricity. Types of tampering include removing and inverting a meter so it will run backwards, taking out a meter and replacing it with jumpers, and putting resistors in series with the meter disconnect switches.

The problem of inversion and running the meter backward can be coped with by using so called unidirectional registers. The possibility of adding resistors can be eliminated by eliminating the disconnect switches. However, neither of these solutions prevent tampering such as removal of the meter and replacement with jumpers.

Various proposals have been made to secure the meter to the socket in different ways so it cannot be removed. These proposals have all been rejected because it is sometimes necessary to remove the meter. For example, in the case of an electrical fire, the immediate course of action is to use the meter as a disconnect device by pulling it out of its socket.

In areas subject to severe winter weather, there is also a need to be able to replace the meter after removal to restore power. For example, if electrical overheating had been taking place and if it had been remedied, it would be necessary to replace the meter in the winter time to prevent freezing inside the metered building.

Often, government regulations will not allow a customer to be immediately deprived of power because he has tampered with a meter and it is necessary to have evidence that an actual theft of electricity has occurred.

Thus, there has been a long felt need for a meter which can be removed and reinstalled by a untrained person only in an emergency and which will inspire the customer not to become an energy thief because it would cost him money or result in legal action against him.

It has also been long known that the meter should also provide a visual indication if it has been tampered with and is in its inoperative condition so that the meter reader or customer will be readily aware of the situation.

SUMMARY OF THE INVENTION

The present invention provides a meter which upon removal from its socket and reinsertion will be operative to conduct electrical power but will provide an indication of having been removed.

One of the bayonets of the meter is provided with a frangible barbed member which will catch onto a terminal in the socket when the meter is installed and which upon removal of the meter will cause the barbed member to move and irrevocably break a frangible link which conductively connects the bayonet to the measuring components of the meter. With further movement of the bayonet, an alternate conductive connection is made and the barbed member latched into place. The barbed portion of the barbed member is then broken off to allow the meter to be removed from its socket.

The present invention provides for speeding up the indicator of the meter upon reinsertion of the meter in the socket by bypassing some of the turns of the potential coil in the measuring components.

The present invention further provides for stopping the indicator of the meter while allowing the meter to conduct electrical power by completely bypassing the potential coil.

The present invention further provides visual indication when the meter has been removed and reinserted in its socket and the alternate conductive connection is in operation.

The above and additional advantages of the present invention will become apparent to those skilled in the art from a reading of the following detailed description when taken in conjunction with the accompanying drawings.

BRIEF DESCRIPTION OF THE DRAWINGS

FIG. 1 is a side view of an electricity meter incorporating the present invention;

FIG. 2 is a top view of a terminal clip in a meter socket;

FIG. 3 is a top view, partly in section, of a bayonet area of a meter and a schematic illustration of the impedance containing circuitry of the preferred embodiment of the present invention;

FIG. 4 is a top view, partially in section, of the bayonet area of a meter and schematic illustration of the potential coil modifying circuitry of alternate embodiments of the present invention.

DESCRIPTION OF THE PREFERRED EMBODIMENTS

Referring to FIG. 1, therein is shown the side view of a meter 10 having a transparent cover 12 secured to a meter base 14. The meter base 14 supports the meter's measuring components 16 which include a several thousand turn potential coil 18 and numerical register 20. The measuring components 16 measure the quantity of electrical power passing among an upper pair of bayonets 22 and lower pair of bayonets 24, and provide signals to the register 20 so it provides an indication proportional to the quantity.

Referring to FIG. 2, therein is shown a terminal 26 which is typical of the four terminals mounted in a meter socket 28 which are slidably engaged by the bayonets when the meter 10 is installed on a building. The terminal 26 includes a fastener 30 which projected through the socket 28 and a spring terminal clip 32 into a mating part such as a nut 34. The terminal clip 32 has a turned in portion 36 and the nut 34 is generally connected to a conductor which is connected either to a source of electrical power (not shown) or, through control switches, to an electrical power utilizing load (not shown).

Referring now to FIG. 3, therein is shown a preferred embodiment of the present invention with one of the bayonets, designated by the numeral 38, which is that bayonet which will engage the terminal 26 which is connected to the electrical source. The bayonet 38 is provided with a longitudinally extending recess 40. A conductive movable member 42 having a frangible barb 44 at one end and a stop 46 at the other is slidably disposed in the recess 40 so as to engage the terminal clip 32 when the bayonet 38 conductively engages it. The movable member 42 is held in conductive contact with the bayonet 38 in a first position near the meter base 14 by a latch arrangement 48. The latch arrangement 48 consists of a pawl 50 pivotable on the meter base 14 and held against the meter base 14 by a spring 52. When the movable member 42 slides, it is stopped by the stop 46 abutting the bayonet 38.

A connector link 54 is affixed to the stop end of the movable member 42. The connector link 54 has first and seconds ends 56 and 58, respectively, separated by a frangible portion 60. The first portion 56 is affixed to meter base 14 and is conductively connected by a main connection 62 to the measuring components 16.

While it is possible to make the connector link 54 visible from the outside of the transparent cover 12, it is more desirable to have a more readily visible indication that the connector link 54 has been broken. In the preferred embodiment, the second end 58 is connected to the measuring components 16 by an alternative conductive connection 66 which contains a visual indicator 64. The visual indicator 64 represents a pair of back to back light emitting diodes which will add substantially no impedance to the connection 66 but will light when AC power is passing therethrough.

When the meter 10 is inserted into the socket 28, the bayonet 38 and the movable member 42 slideably engage the terminal clip 30 and electrical power is transmitted through the bayonet 38, the movable member 42, the connector link 54, and the lead 62 to the measuring components 16.

When the meter 10 is removed from the socket 28, the barb 44 of the movable member 42 engages and catches on a turned in portion 36 of the terminal clip 32. The relative breaking loads of the frangible portion 60 of the connector link 54 and the frangible barb 44 are selected such that the frangible portion 60 breaks first at a first predetermined loading. The movable member 42 then slides relative to the bayonet 38 and causes the latch 48 to open and then be closed by the spring 52 upon further removal of the meter 10 from the meter socket 28. When the stop 46 abuts the bayonet 38 so that any further movement of the movable member 42 is prevented, complete removal of the meter 10 results in the barb 44 being broken off the movable member 42 at a second predetermined loading.

If the meter 10 is later reinserted in the socket 28, the stop 46 abuts the pawl 50 and irrevocably latches the movable member 42 from returning to its first position. With the connector link 54 broken to irrevocably disconnect the main connection to the measuring components 16, the electrical power passes through member 42 and the second end 58 of the connector link to light the indicator light 64 and then passes to the measuring components 16.

A printed notice on the meter will inform the customer or meter reader that the meter has been tampered with when the indicator light 64 is lit and that the utility company must be contacted for a replacement meter. With this arrangement, the maximum power loss would be limited to that lost during one billing period because the meter reader can easily check for tampering at the end of each period.

While special tools could be made to allow resetting of the latch 48 and replacement of the connector link 54 in the field, it is believed that it would be more desirable to merely replace the meter in the field and reset the meter at the utility company's shop after a comprehensive disassembly. This would prevent possible energy theft by unauthorized use of special tools to field reset meters which have been tampered with. It is in the sense that field resetting and/or replacement would be quite difficult that the term "irrevocably" is used herein.

Thus, a meter is provided in which any energy theft which is accomplished by removing the meter, tampering with it, and reinstalling it will be obvious because of the visible light indication.

Referring now to FIG. 4, therein is shown a further alternate embodiment in which the same elements as shown in previous figures are indicated by the same numbers. In this embodiment the movable member 42 is provided with a connector contact 70 which is movable between a first and second contacts 72 and 74 when the movable member 42 is respectively slid between its first and second positions. The second contact 74 is connected to the potential coil between its ends by an alternative conductive connection 76 which contains a visual indicator 78. The visual indicator 78 represents a number of conventional light producing devices including back to back light emitting diodes, an incadescent lamp, or a liquid crystal display with proper impedances in place as would be obvious to those skilled in the art.

In the first position, there would be normal operation with power passing through the first contact 72 and through the lead 62 to the measuring components 16; however, in the second position power would pass through the second contact 74 through the second contact 74 and the visual indicator 78 contained in the alternative conductive connection 76 to the potential coil 18 at a point which is a fixed number of turns from the end to which the first contact 72 and the main conductive connection 62 is connected. Again return to the first position would be irrevocably prevented by the latch 48.

In one embodiment, the connection 76 is located 20% of the turns from the first contact end whereby the measuring components 16 will measure approximately 120% of actual power and provide readings at the register 20 which are 20% high.

A printed notice on the meter will inform the customer or meter reader that the meter has been tampered with when the visual indicator 78 is lit and that the utility company must be contacted for a replacement meter. Further, the notice will indicate that the customer will be billed 20% extra until the replacement is in place. This would provide incentive for a customer to promptly report meters which have been tampered with.

An alternative approach also shown in FIG. 4 is to bypass the potential coil 18 entirely with an alternative conductive connection 80. In this embodiment, the measuring components 16 will be stopped even though the power is still supplied. If the visual indicator 78 is lit, and the meter stopped, the customer can be told that his tampering has resulted in his obtaining power for which he has not paid and he may be warned of the possibility of being charged with energy theft.

It should be noted that the various portions of the embodiments may be interchanged by those skilled in the art; i.e., either the frangible link or the dual contact systems may be used with any of the alternate conductive connections with minor modifications which would be obvious to those skilled in the art.

As many possible embodiments may be made of the invention without departing from the scope thereof, it is to be understood that all matter herein set forth or shown in the accompanying drawings is to be interpreted in an illustrative and not a limiting sense.

I claim:

1. An electricity meter engageable with a meter socket to allow operative connection between a source of electrical power and an electrical power utilizing load, comprising:
    measuring means for measuring the quantity of electrical power passing therethrough and normally providing an indication proportional thereto;
    engagement means conductively engageable with said meter socket and disengageable therefrom;
    said engagement means including movable engagement means provided therein conductively engageable in a first position with said meter socket and movable to a second position upon disengagement therefrom;
    main connecting means operatively connected between said engagement means and said measuring means operable to allow the conduction of electrical power therebetween, said main connecting means responsive to the disengagement of said movable engagement means from said meter socket to become inoperable to allow the conduction of electrical power between said movable engagement means and said meter socket; and
    latching means operatively associated with said movable engagement means, said latching means including a pawl associated with said movable engagement means and engageable therewith to normally hold said movable engagement means in said first position and to prevent return of said movable engagement means to said first position when said movable engagement means is moved into said second position, whereby the conduction of electrical power between said movable engagement means and said measuring means is altered when said movable engagement means reengages said socket.

2. The invention as claimed in claim 1 including alternative connecting means operable to conductively connect said movable engagement means and said measuring means responsive to said movable engagement means moving to said second position to allow the conduction of electrical power between said movable engagement means and said measuring means, said alternative connecting means including indicator means responsive to the conduction of electrical power through said alternative connecting means to provide an indication that said meter has been disengaged from said meter socket and reengaged.

3. The invention as claimed in claim 1 wherein said measuring means includes a potential coil conductively connected at one end to said main connecting means, and including alternative connecting means operable to conductively connect said engagement means and a point on said potential coil distal from said one end thereof responsive to said main connecting means becoming inoperative to allow the conduction of electrical power between said movable engagement means and said one end of said potential coil and said movable engagement means moving to said second position to conduct electrical power between said movable engagement means and said point on said potential coil whereby said measuring means will provide an indication greater than the quantity of electrical power passing through said measuring means when said meter reengages said meter socket.

4. The invention as claimed in claim 1 wherein said measuring means includes a potential coil conductively connected at one end to said main connecting means, and including alternative connecting means operable to conductively connect said movable engagement means and an opposite end of said potential coil opposite said one end thereof responsive to said main connecting means becoming inoperable to allow the conduction of electrical power between said engagement means and said potential coil and said movable engagement means moving to said second position to allow the conduction of electrical power from said movable engagement means to said opposite end of said potential coil whereby said measuring means will provide an indication that no electrical power has passed through said measuring means regardless of the quantity of electrical power passing therethrough when said meter reengages said meter socket.

5. The invention as claimed in any one of claims 3, or 4 wherein said alternative connecting means includes indicator means responsive to the conduction of electrical power by said alternative connecting means to provide a visual indication that said engagement means has been disengaged from said meter socket and reengaged.

6. The invention as claimed in any one of claims 2, 3, or 4 wherein said main conducting means has a first end secured to said meter and connected to said measuring means, said main connecting means has a second end secured to said movable engagement means and connected to said alternative connecting means, and said first and second ends of said main conducting means are conductively disconnected when said movable engagement means moves from said first to said second position.

7. The invention as claimed in any one of claims 2, 3, or 4 wherein said main conducting means is connectable to said movable engagement means only in said first position thereof and said alternative connecting means is connectable to said movable engagement means only in said second position thereof.

8. An electricity meter engageable with terminals in a meter socket to allow operative connection between a source of electrical power and an electrical power utilizing load, comprising:
    measuring means for measuring the quantity of electrical poer passing therethrough and normally providing an indication proportional thereto;
    a bayonet conductively engageable with a terminal in said meter socket and disengageable therefrom;
    a movable member provided in and conductively contacting said bayonet, said movable member having a first end engageable in a first position with said terminal, said movable member being movable to a second position upon disengagement from said bayonet, said movable member having a second end having a stop provided thereon to prevent removal of said movable member from said bayonet;
    main connecting means operatively connected between said movable member and said measuring means operable to allow conduction of electrical power from said movable member to said measuring means, said main connecting means responsive to the disengagement of said movable member from said terminal to become inoperable to allow the conduction of electrical power between said movable member and said terminal; and latching means comprising a pawl associated with said stop of said movable member and biased into contact therewith to normally hold said movable member in said first position and to prevent return of said movable member to said first position when said movable member is moved into said second position, whereby the conduction of electrical power between said bayonet and said measuring means is altered when said movable member reengages said terminal.

9. The invention as claimed in claim 8 including alternative connecting means operable to conductively connect said movable member and said measuring means to allow the conduction of electrical power between said bayonet and said measuring means, when said movable member is moved to said second position, said alternative connecting means including indicator means responsive to the conduction of electrical power through said alternative connecting means to provide an visual indication that said meter has been disengaged from said meter socket and reengaged.

10. The invention as claimed in claim 8 wherein said measuring means includes a several thousand turn potential coil conductively connected at one end to said main connecting means, and including alternative connecting means operable to conductively connect said bayonet and a point on said potential coil a predetermined number of turns from said one end thereof responsive to said main connecting means becoming inoperative to allow the conduction of electrical power between said movable engagement means and said one end of said potential coil and said movable member moving to said second position to conduct electrical power between said movable member and said point on said potential coil whereby said measuring means will provide an indication greater than the quantity of electrical power passing through said measuring means when said meter reengages said meter socket.

11. The invention as claimed in claim 8 wherein said measuring means includes a potential coil conductively connected at one end to said main connecting means, and including alternative connecting means operable to conductively connect said movable member and an opposite end of said potential coil opposite said one end thereof responsive to said main connecting means becoming inoperable to allow the conduction of electrical power between said engagement means and said potential coil and said movable engagement means moving to said second position to allow the conduction of electrical power from said movable engagement means to said opposite end of said potential coil whereby said measuring means will provide an indication that no electrical power has passed through said measuring means regardless of the quantity of electrical power passing therethrough when said meter reengages said meter socket.

12. The invention as claimed in any one of claims 10 or 11 wherein said alternative connecting means includes light providing elements responsive to the conduction of electrical power by said alternative connecting means to provide a visual indication that said engagement means has been disengaged from said meter socket and reengaged.

13. The invention as claimed in any one of claims 9, 10, or 11 wherein said main connecting means has a first end secured to said meter and connected to said measuring means, said main connecting means has a second end secured to said movable member and connected to said alternative connecting means, and said main connecting means has a conductive frangible portion connecting said first and second ends, said frangible portion being breakable when said movable member moves from said first to said second position.

14. The invention as claimed in any one of claims 9, 10, or 11 wherein said main connecting means has a first end secured to said meter and connected to said measuring means, said main connecting means has a second end secured to said movable member and connected to said alternative connecting means, and said main connecting means has a conductive frangible portion connecting said first and second ends, said frangible portion being breakable at a first predetermined load between said first and second ends, and said movable member includes a frangible barb portion engageable with the terminal and breakable at a second predetermined load between said movable member and said terminal with said first predetermined load being less than said first predetermined load whereby the frangible portion will break before said frangible barb breaks to allow said meter to be removed from said socket.

15. The invention as claimed in any one of claims 9, 10, or 11 wherein said movable member includes a contact conductively engaging said main connecting means only in said first position of said movable member and conductively engaging said alternative connecting means only in said second position thereof.

16. The invention as claimed in any one of claims 8, 9, 10, or 11 wherein said movable member includes a frangible barb portion engageable with the terminal and breakable at a predetermined load greater than said latching means biasing of said movable member to allow removal of said engagement means.

* * * * *

UNITED STATES PATENT AND TRADEMARK OFFICE
CERTIFICATE OF CORRECTION

PATENT NO. : 4,386,314

DATED : May 31, 1983

INVENTOR(S) : Dale F. Becker

It is certified that error appears in the above-identified patent and that said Letters Patent are hereby corrected as shown below:

Column 3, line 27, "30" should read — 32 —.

Column 4, lines 28 and 29, delete "through the second contact 74" (first occurrence).

In the Claims:

Claim 8, column 6, line 47, "poer" should read — power —.

Signed and Sealed this

Thirteenth Day of September 1983

[SEAL]

Attest:

GERALD J. MOSSINGHOFF

*Attesting Officer*  *Commissioner of Patents and Trademarks*